(12) United States Patent
Rehmann et al.

(10) Patent No.: US 8,553,409 B2
(45) Date of Patent: *Oct. 8, 2013

(54) SYSTEM AND METHOD FOR PORTABLE INFORMATION HANDLING SYSTEM PARALLEL-WALL THERMAL SHIELD

(75) Inventors: Mark L. Rehmann, Georgetown, TX (US); David McKinney, Austin, TX (US); Anil Damani, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 945 days.

This patent is subject to a terminal disclaimer.

(21) Appl. No.: 12/147,814

(22) Filed: Jun. 27, 2008

(65) Prior Publication Data

US 2009/0323275 A1 Dec. 31, 2009

(51) Int. Cl.
*H05K 7/20* (2006.01)
*G06F 1/20* (2006.01)
*F28F 7/00* (2006.01)
*H05K 5/00* (2006.01)
*H01L 23/46* (2006.01)

(52) U.S. Cl.
CPC .............. *G06F 1/203* (2013.01); *H01L 23/46* (2013.01); *H05K 7/20154* (2013.01)
USPC .............. 361/679.47; 361/679.49; 361/697; 165/80.3; 174/16.1; 454/184

(58) Field of Classification Search
USPC ............. 361/679.46–679.49, 679.54–679.55, 361/690, 694–695, 697, 702, 704; 165/80, 165/3, 185; 174/16.1, 16.3; 454/184
See application file for complete search history.

(56) References Cited

U.S. PATENT DOCUMENTS

| | | | |
|---|---|---|---|
| 5,424,915 A * | 6/1995 | Katooka et al. | 361/695 |
| 5,694,294 A * | 12/1997 | Ohashi et al. | 361/679.48 |
| 5,704,212 A | 1/1998 | Erler et al. | |
| 5,828,552 A | 10/1998 | Ma | |
| 5,856,911 A * | 1/1999 | Riley | 361/704 |
| 6,076,787 A | 6/2000 | Troyer | |
| 6,115,249 A | 9/2000 | Cipolla et al. | |
| 6,226,182 B1 * | 5/2001 | Maehara | 361/695 |
| 6,414,842 B1 | 7/2002 | Cipolla et al. | |
| 6,415,612 B1 * | 7/2002 | Pokharna et al. | 62/3.2 |
| 6,466,438 B1 | 10/2002 | Lim | |
| 6,474,614 B2 | 11/2002 | MacEachern | |
| 6,487,073 B2 | 11/2002 | McCullough et al. | |
| 6,529,369 B1 | 3/2003 | Zarek et al. | |

(Continued)

FOREIGN PATENT DOCUMENTS

| | | | | |
|---|---|---|---|---|
| JP | 2000223876 A | * | 8/2000 | G06F 1/20 |
| JP | 2001075677 A | * | 3/2001 | |

*Primary Examiner* — Zachary M Pape
(74) *Attorney, Agent, or Firm* — Terrile, Cannatti, Chamber & Holland, LLP; Robert W. Holland

(57) ABSTRACT

An information handling system's thermal management is selectively altered by coupling a thermal barrier to the bottom surface of the information handling system chassis so that an air channel insulates against the passage of thermal energy from the bottom surface. A vent opening in a side of the thermal barrier allows airflow through the air channel to a vent opening of the information handling system. The airflow through the air channel cools the base of the thermal barrier so that an end user will experience reduced thermal energy if the information handling system rests on the end user, such as in the end user's lap.

18 Claims, 10 Drawing Sheets

(56) References Cited

U.S. PATENT DOCUMENTS

| | | | |
|---|---|---|---|
| 6,545,866 B2 * | 4/2003 | Katsui et al. | 361/690 |
| 6,599,090 B2 * | 7/2003 | Ozaki et al. | 415/206 |
| 6,646,874 B2 * | 11/2003 | Pokharna et al. | 361/679.09 |
| 6,672,380 B2 | 1/2004 | Wei | |
| 6,682,040 B1 | 1/2004 | MacEachern | |
| 6,687,123 B2 * | 2/2004 | Kitahara | 361/695 |
| 6,837,057 B2 * | 1/2005 | Pokharna et al. | 62/3.2 |
| 6,894,896 B2 | 5/2005 | Lin | |
| 7,110,254 B2 * | 9/2006 | Hara et al. | 361/679.26 |
| 7,121,214 B1 | 10/2006 | Toltzman et al. | |
| 7,161,799 B2 | 1/2007 | Lim et al. | |
| 7,173,819 B2 | 2/2007 | Wilcox | |
| 7,218,517 B2 * | 5/2007 | Wolford et al. | 361/695 |
| 7,249,747 B2 | 7/2007 | Marceau et al. | |
| 7,342,783 B2 * | 3/2008 | Park | 361/679.48 |
| 7,474,526 B2 * | 1/2009 | Fujiwara | 361/679.52 |
| 8,189,331 B2 * | 5/2012 | Senatori | 361/679.48 |
| 2007/0091560 A1 * | 4/2007 | Parker | 361/687 |
| 2007/0097626 A1 * | 5/2007 | Huang et al. | 361/687 |
| 2008/0130234 A1 * | 6/2008 | Maehara et al. | 361/704 |

* cited by examiner

SYSTEM AND METHOD FOR PORTABLE INFORMATION HANDLING SYSTEM PARALLEL-WALL THERMAL SHIELD

CROSS REFERENCE TO RELATED APPLICATIONS

The present application is related to and claims the benefit of U.S. patent application Ser. No. 12/022,495 entitled "System and Method for Managing Portable Information Handling System Cooling" and naming Erick Arsene Siba and Anil Damani as inventors and U.S. patent application Ser. No. 12/058,691, entitled "System and Method for Portable Information Handling System Thermal Shield" and naming Mark Rehmann, David McKinney and Anil Damani as inventors. All subject matter of U.S. patent application Ser. Nos. 12/022,495 and 12/058,691 are incorporated herein by reference to the extent such subject matter is not inconsistent herewith.

BACKGROUND OF THE INVENTION

1. Field of the Invention

The present invention relates in general to the field of information handling system cooling, and more particularly to a system and method for a portable information handling system parallel-wall thermal shield.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

When information handling systems were first developed, manufacturers typically built large box-shaped housings to hold the many components used to build an information handling system. Over time, manufacturers strove to reduce the size of information handling system housings so that their reduced footprint had less of an impact in an office or home environment. Eventually, portable information handling systems entered the market with housings sized so that an end user could carry the system while in use. Portable information handling systems initially tended to have reduced capabilities compared with desktop or tower information handling systems since the portable housing had to include a power source and integrated display. Manufacturers of portable information handling systems tended to use smaller and less capable components, which tended to have smaller footprints and reduced power consumption. However, increasing capabilities and decreasing size of components used to build information handling systems has led to greater capabilities in portable information handling systems. The improved capabilities of portable information handling systems has led to greater acceptance and usage of portable information handling systems so that end users have recently tended towards selecting portable systems as replacements for desktop and tower information handling systems.

Manufacturers typically face two substantial challenges when incorporating more advanced components into portable housings so that portable information handling system performance approaches that of desktop and tower systems: power consumption and cooling. More powerful processing components tend to consume more power when performing increased numbers of calculations and thus reduce the time that portable information handling system can operate on internal power, such as a battery. More powerful processing components also tend to produce additional heat as a byproduct when performing increased numbers of calculations. Cooling components within a portable housing presents a challenge since the reduced size of the housing makes an effective cooling airflow difficult to achieve. Further, creating a substantial airflow through a portable housing uses additional power and tends to gather dust at the cooling vents through which the airflow travels, making the cooling airflow less efficient. One approach used to manage power consumption and heat is to throttle the operation of processing components, such as CPU operating speeds, so that less power is consumed and less heat created. However, throttling processing components reduces the operating capability of the information handling system. In some systems, heat generated by processing components, even in a throttled state, can make a portable information handling system uncomfortable for an end user to hold in his lap. End users sometimes place a heat barrier beneath the portable information handling system to protect their lap from this heat, such as pads, bases or shields that insulate a user's lap from the heat of the information handling system chassis. Some examples of insulating pads include the Belkin Laptop Cooling Stand, the Targus Notebook Chill Mat, the Zalman NC 1000-B Notebook Cooler and the Belkin Laptosh Cush Case.

SUMMARY OF THE INVENTION

Therefore a need has arisen for a system and method which manages information handling system performance based on whether a barrier protects an end user from heat produced by the information handling system.

A further need exists for a system and method which selectively couples and decouples a thermal barrier to an information handling system.

In accordance with the present invention, a system and method are provided which substantially reduce the disadvantages and problems associated with previous methods and systems for managing information handling system performance. Coupling and uncoupling of a thermal barrier to an information handling system is detected to select thermal parameters for managing cooling within the information handling system.

More specifically, a thermal manager operating in firmware of an information handling system, such as the BIOS, sets thermal parameters for managing cooling within the chassis of the information handling system based on detection of coupling or uncoupling of a thermal barrier to the bottom of the chassis by a thermal barrier attachment detector. If a thermal barrier is coupled to the base of the information handling system chassis, the thermal manager selects thermal parameters that allow a higher temperature within the chassis than is allowed without a thermal barrier. The higher internal temperature allows the cooling fan to rotate at a slower speed and the CPU to operate at a greater clock speed since the thermal barrier will protect against passage of excess thermal energy from the bottom of the information handling system chassis to an end user. Operating the cooling fan at slower rotation speeds reduces dust and other contaminants from building up within the cooling subsystem of the information handling system so that the cooling subsystem operates more efficiently for a greater lifetime. Cooling system lifetime efficiency is further extended by including a filter in the thermal barrier.

In another embodiment, a thermal barrier is selectively coupled and decoupled with an information handling system chassis to selectively provide increased thermal insulation at the bottom of the information handling system. The thermal barrier has a base and four sides that form an air channel between the base and the bottom surface of the information handling system. A vent formed in a side or the base of the thermal barrier accepts airflow into the air channel which directs the airflow to a vent of the information handling system. A cooling fan operating in the information handling system pulls air through the air channel help to keep the base of the thermal barrier cool. In one embodiment, the bottom surface of the information handling system chassis has a conductive material to conducts thermal energy to the air channel. In an alternative embodiment, a heat transfer mechanism extends through the bottom surface of the chassis and into the air channel to aid in the transfer of thermal energy from within the chassis. If conductive material is exposed within the air channel, the thermal barrier integrates with the chassis as a contiguous piece so that an end user will not be exposed to excessive thermal energy by inadvertent removal of the thermal barrier. The sides of the thermal barrier seal against the chassis to help direct the cooling airflow from the thermal barrier vent to the cooling fan vent.

The present invention provides a number of important technical advantages. One example of an important technical advantage is that information handling system performance is selectively increased if a barrier is detected that protects an end user from heat created by the information handling system. By increasing allowed operating temperatures, processing component performance may increase for a better end user experience and cooling subsystem operations may decrease for reduced acoustic noise and power consumption, such as by running a cooling fan at a lower speed. Reduced cooling fan operating speeds reduce build of dust in vents for improved long term operations of the information handling system. The ability to detect a heat barrier and adjust cooling subsystem operations accordingly allows information handling systems to be built smaller, thinner and lighter, giving end users the option of attaching a heat barrier if greater system performance is desired.

Another example of an important technical advantage is that an end user selectively couples and decouples the thermal barrier with the chassis as desired to protect the bottom surface of the information handling system from excess heat or to maintain a compact form. The air channel improves overall system cooling while reducing thermal energy exposure in areas proximate to an end user. The cooling channel provides an elegant and smooth exterior form for the information handling system and also provides additional room to add desired features, such as a larger cooling fan or additional stiffening for a stronger system housing. The additional cooling and reduced release of thermal energy at the bottom surface of an information handling system is accomplished with minimal additional height and without powered components, such as additional fans. A thermal barrier can be added at other areas of the information handling system where excessive thermal energy is found, such as a palm rest.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
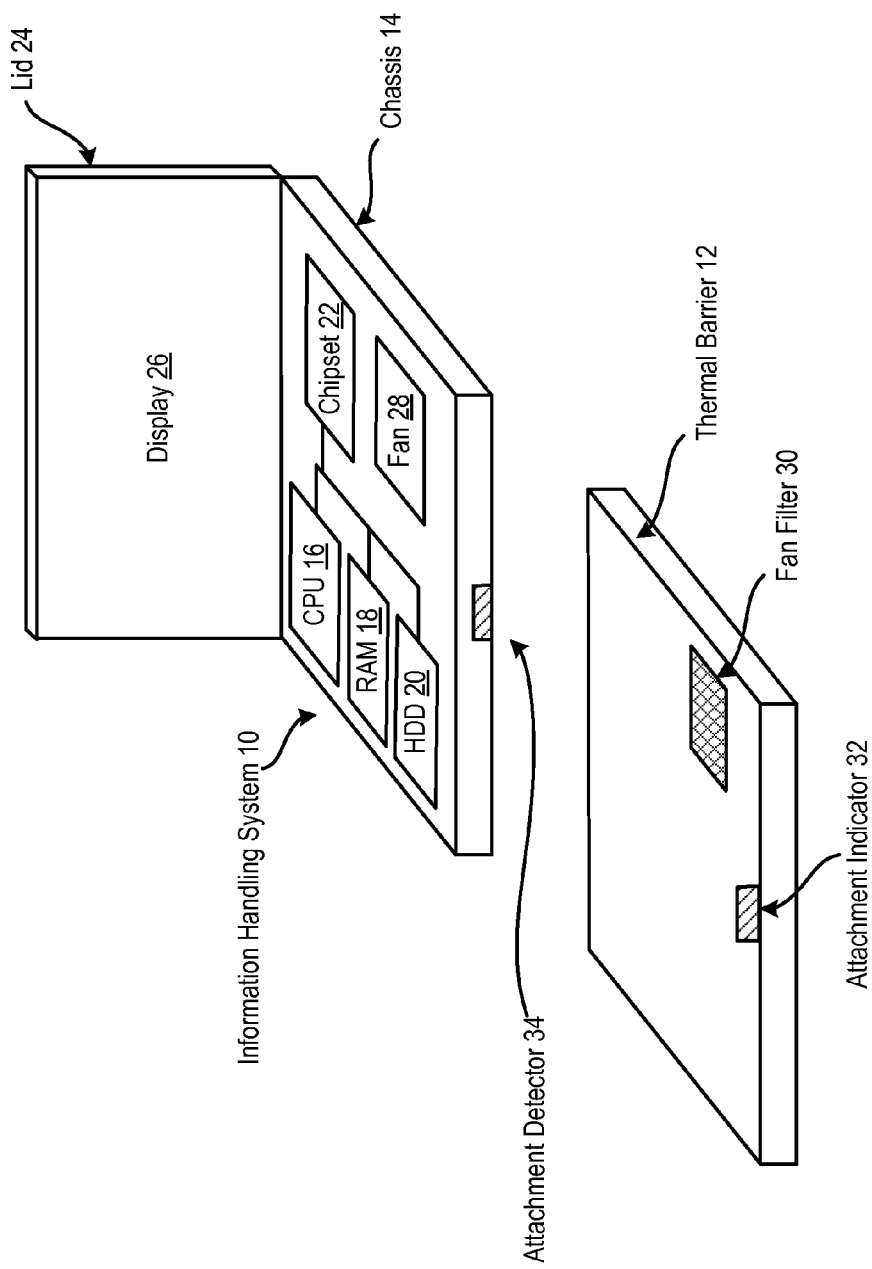
FIG. 1 depicts a portable information handling system in an open position and having a thermal barrier aligned to couple to the bottom surface of its chassis.

Referring now to FIG. 1, a portable information handling system 10 is depicted in an open position and having a thermal barrier 12 aligned to couple to the bottom surface of its chassis 14. Chassis 14 has a bottom portion that supports plural processing components, such as CPU 16, RAM 18, hard disk drive 20 and chipset 22, and a lid 24 that supports a display 26, such as an integrated liquid crystal display (LCD). Heat generated by the processing components within chassis 14 is removed by a cooling fan 28, which generates a cooling airflow through vents formed in the side and bottom surfaces of chassis 14. The speed at which cooling fan 28 operates is set by firmware in chipset 22 to prevent excessive internal temperatures within chassis 14 while running cooling fan 28 at a minimal speed to reduce power consumption and acoustic noise. In the example of the portable information handling system 10 depicted by FIG. 1, the temperature maintained within chassis 14 is also kept to a maximum value so that the bottom surface temperature will not become uncomfortable for an end user who places portable information handling system 10 in her lap. In the event that cooling fan 28 cannot keep the bottom surface temperature sufficiently low, throttling of CPU 16 to operate at slower clock speeds is commanded by the firmware to reduce the heat produced by CPU 16 and thus the amount of thermal energy that cooling fan 28 must remove from within chassis 14.

Although CPU throttling will help maintain a comfortable temperature at the bottom surface of chassis 14, CPU throttling also reduces the performance of information handling system 10. In order to improve information handling system performance by reducing the need for CPU throttling to maintain a comfortable temperature at the bottom of chassis 14, thermal barrier 12 couples to the bottom surface of chassis 14 to reduce the amount of thermal energy passed from chassis 14 to an end user. Thermal barrier 12 is, for instance, a hollow or insulated piece sized to align and couple with the bottom surface of chassis 14. Alternatively, thermal barrier 12 provides additional functions to information handling system 12, such as an external attachable battery slice or media slice having an optical drive. In the embodiment depicted by FIG. 1, a fan filter 30 is integrated in thermal barrier 12 so that cooling airflow pulled by fan 28 into chassis 14 is filtered before entering chassis 14. Fan filter 30 is removable for cleaning so that captured dust does not slow cooling airflow. By capturing contaminants that would otherwise enter chassis 14, fan filter 30 prevents clogging of cooling elements within chassis 14, which can decrease the efficiency of cooling elements forcing greater CPU throttling and fan speeds. An attachment indicator 32 aligns with an attachment detector 34 so that firmware in chipset 22 detects whether or not thermal barrier 12 is coupled to chassis 14. Thermal parameters are selected for managing cooling within chassis 14 based on whether or not thermal barrier 12 is coupled to the bottom of chassis 14. For example, internal operating temperatures are increased if thermal barrier 12 is coupled to chassis 12, thus reducing the need for CPU throttling and increasing performance of information handling system 10.

Figure 2:
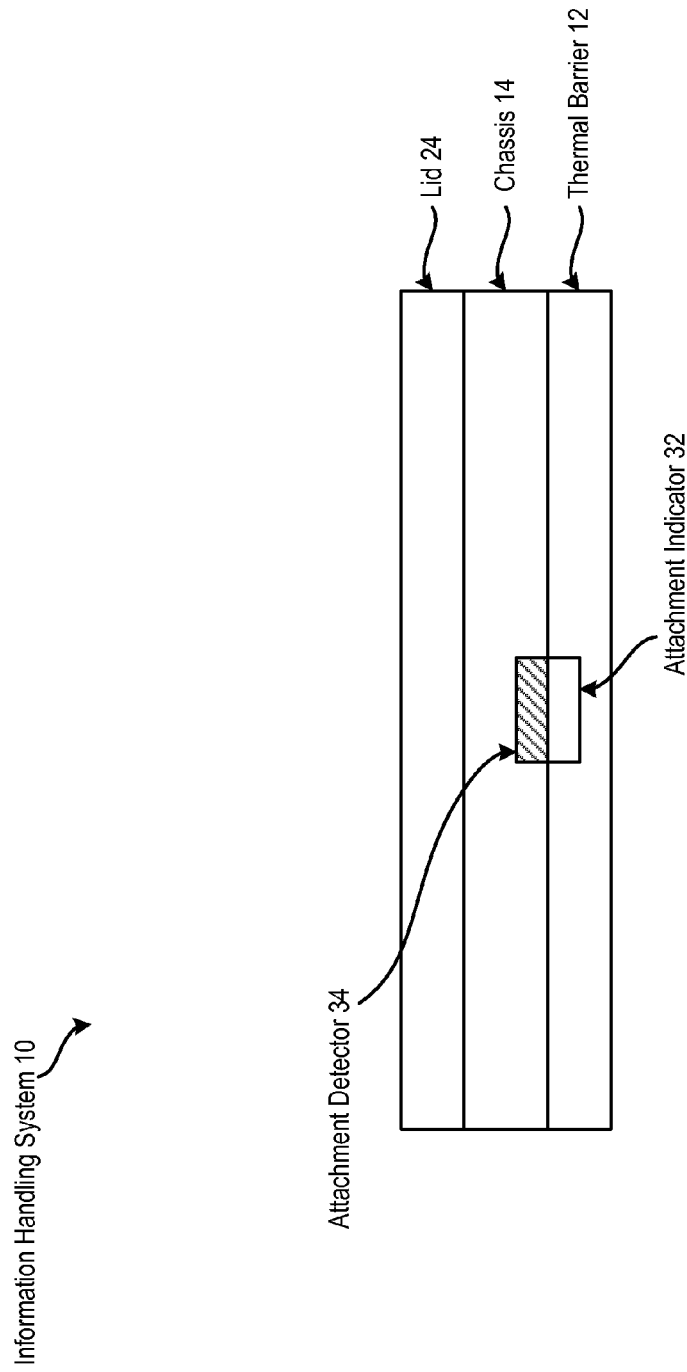
FIG. 2 depicts a side view of a portable information handling system in a closed position with a thermal barrier coupled to the bottom surface of its chassis.

Referring now to FIG. 2, a side view depicts a portable information handling system 10 in a closed position with a thermal barrier 12 coupled to the bottom surface of its chassis 14. Attachment indicator 32 inserts into attachment detector 34 to communicate the presence of thermal barrier coupled to chassis 14. For example, attachment indicator 32 may insert a pin into a switch of attachment detector 34 to indicate the coupling of thermal barrier 12. Alternatively, attachment indicator 32 may communicate identification information to attachment detector 34 to identify the type of thermal barrier 12 that is coupled to chassis 14. For example, identification information provided by thermal barrier 12 indicates the degree of insulation provided by thermal barrier 12 so that thermal parameters for operating with different types of thermal barriers are applied by information handling system 10 to prevent excessive heat at the bottom surface of thermal barrier 12. Thermal barrier 12 increases the height of information handling system 10 in the closed position, making information handling system 10 less portable when attached. Thus, an end user has the option to attach thermal barrier 12 when greater information handling system performance is desired and to remove thermal barrier 12 when greater portability is desired.

Figure 3:
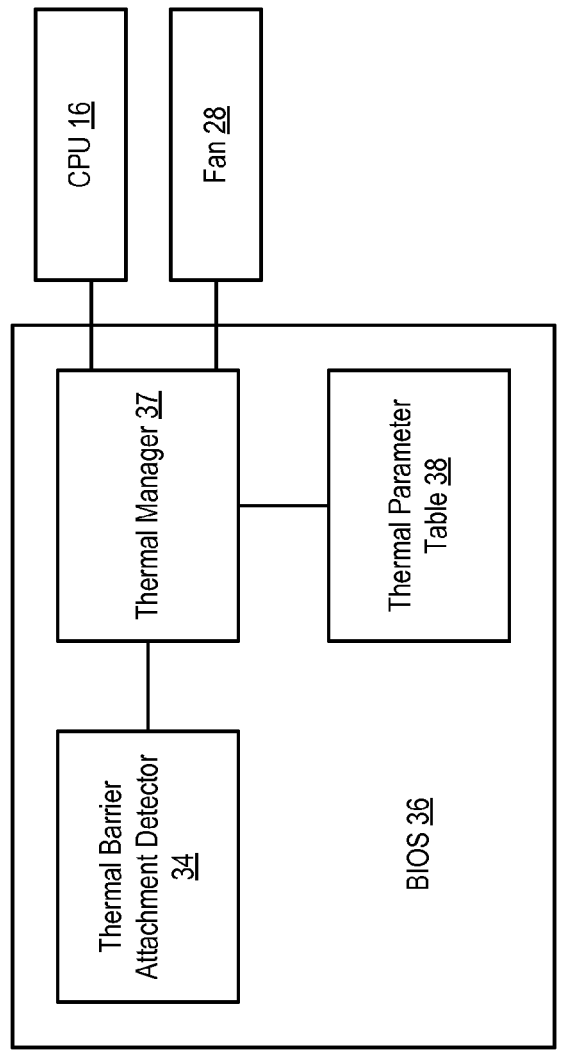
FIG. 3 depicts a block diagram of a system for managing information handling system cooling based on whether a thermal barrier is coupled to the information handling system.

Referring now to FIG. 3, a block diagram depicts a system for managing information handling system cooling based on whether a thermal barrier is coupled to the information handling system. Firmware instructions in a Basic Input/Output System (BIOS) 36 include thermal barrier attachment detector 34, which detects attachment of a thermal barrier to an information handling system and signals the attachment to a thermal manager 37. Thermal manager 37 selects thermal parameters for use in operation of the information handling system from a thermal parameter table 38 and commands operation of CPU 16 and fan 28 according to the selected thermal parameters. If a thermal barrier is detected by thermal barrier attachment detector 34, then thermal manager 37 selects thermal parameters from thermal parameter table 38 to allow an increased operating temperature so that CPU 16 operates at relatively higher clock speeds and fan 28 operates at relatively lower rotation speeds. If no thermal barrier is detected, thermal manager 37 selects thermal parameters from thermal parameter table 38 for normal operating conditions so that CPU 16 operates at a relatively lower clock speed and fan 28 operates at a relatively higher rotation speed. In one embodiment, an identifier provided by thermal barrier attachment detector 34 to thermal manager 37 allows selection of thermal parameters based upon the relative insulation provided by the thermal barrier. For example, a battery or optical drive thermal slice might provide less insulation than a thermal slice designed specifically for blocking transfer of thermal energy.

Figure 4:
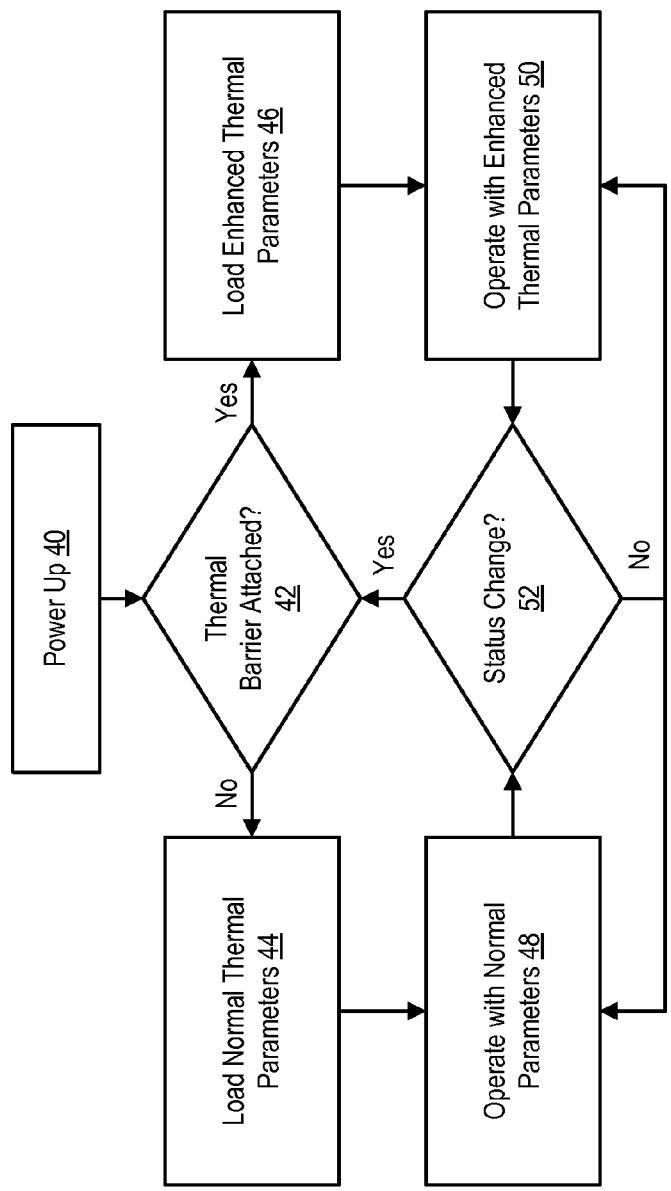
FIG. 4 depicts a flow diagram of a process for managing information handling system cooling based on whether a thermal barrier is coupled to the information handling system.

Referring now to FIG. 4, a flow diagram depicts a process for managing information handling system cooling based on whether a thermal barrier is coupled to the information handling system. The process begins at step 40 with power up of the information handling system. At step 42, a determination is made of whether a thermal barrier is attached to the information handling system. If no, the process continues to step 44 to load normal thermal parameters for managing cooling of the information handling system. If yes, the process continues to step 46 to load enhanced thermal parameters for managing cooling of the information handling system with elevated internal operating temperatures. At step 48, the information handling system operates at normal parameters and, at step 50, the information handling system operates with enhanced thermal parameters. Periodically, the process continues to step 52 to determine if a status change has occurred, such as the coupling or uncoupling of the thermal barrier to the information handling system. If the thermal barrier status remains unchanged the process continues to step 48 or 50 based on the status of the thermal barrier coupling. If a status change has occurred in the coupling or uncoupling of the thermal barrier, the process returns to step 42 to determine if the thermal barrier is attached. For example, the information handling system is rebooted to reset the thermal parameters in the firmware.

Figure 5:
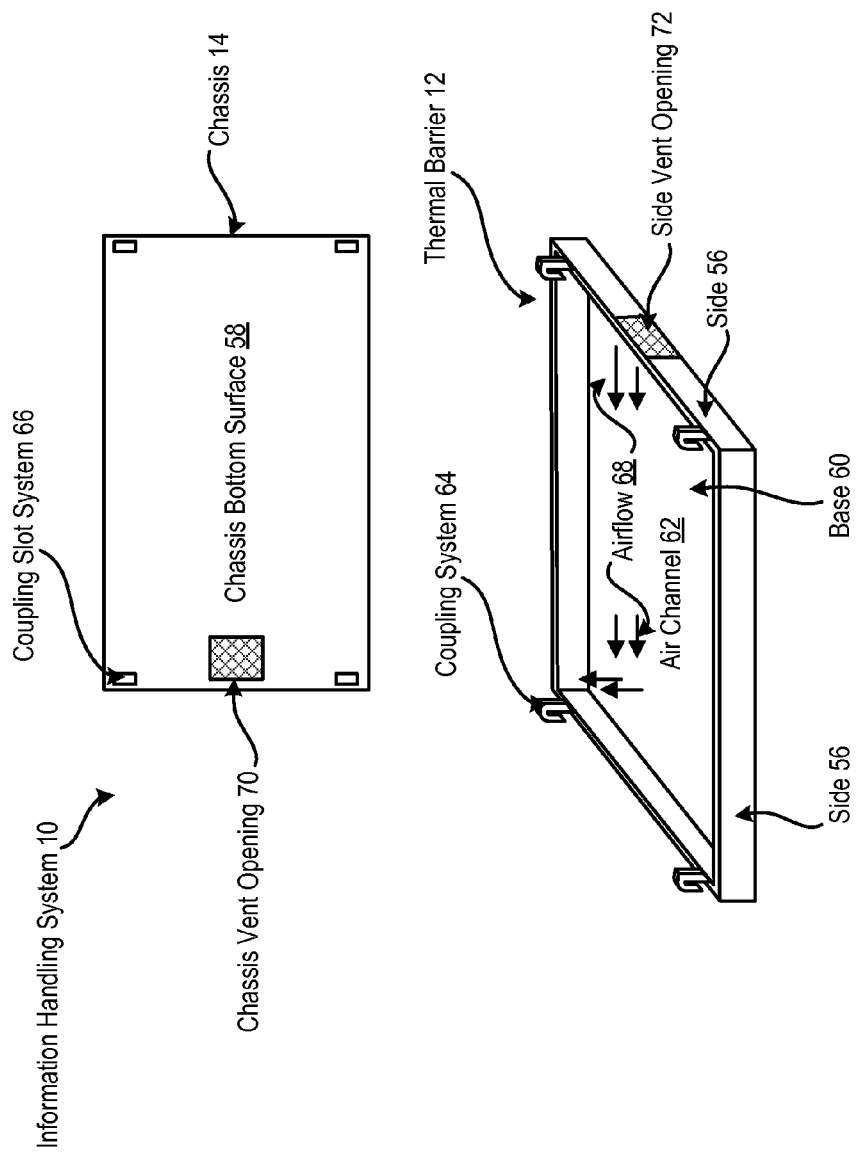
FIG. 5 depicts a thermal barrier having sides aligned to seal at the bottom surface of an information handling system chassis.

Referring now to FIG. 5, a thermal barrier 12 is depicted having sides 56 aligned to seal at the bottom surface 58 of an information handling system chassis 14. In the example embodiment depicted by FIG. 5, thermal barrier 12 has a rectangular shape with four sides 56 and a base 60 that form an air channel 62 when sides 56 couple at the outer perimeter of chassis bottom surface 58. A coupling system 64, depicted in the example embodiment as hooks extending from sides 56, couples thermal barrier 12 to chassis 14, such as by engaging hooks 64 into coupling system slots 66, so that sides 56 seal air channel 62 about the perimeter of bottom surface 58. Cooling airflow is pulled through air channel 62 as depicted by arrows 68 by a cooling fan running in information handling system 10 that pulls air through a chassis vent opening 70. Airflow 68 enters air channel 62 through a side vent opening 72 located in a side 56 at the opposite end of information handling system 10 relative to the location of chassis vent opening 70. Locating thermal barrier vent 72 at an opposite end of information handling system 10 relative to chassis vent 70 causes airflow 68 to travel across substantially all of the length of air channel 62 to help cool base 60 which is design to rest on an end user's lap.

Figure 6:
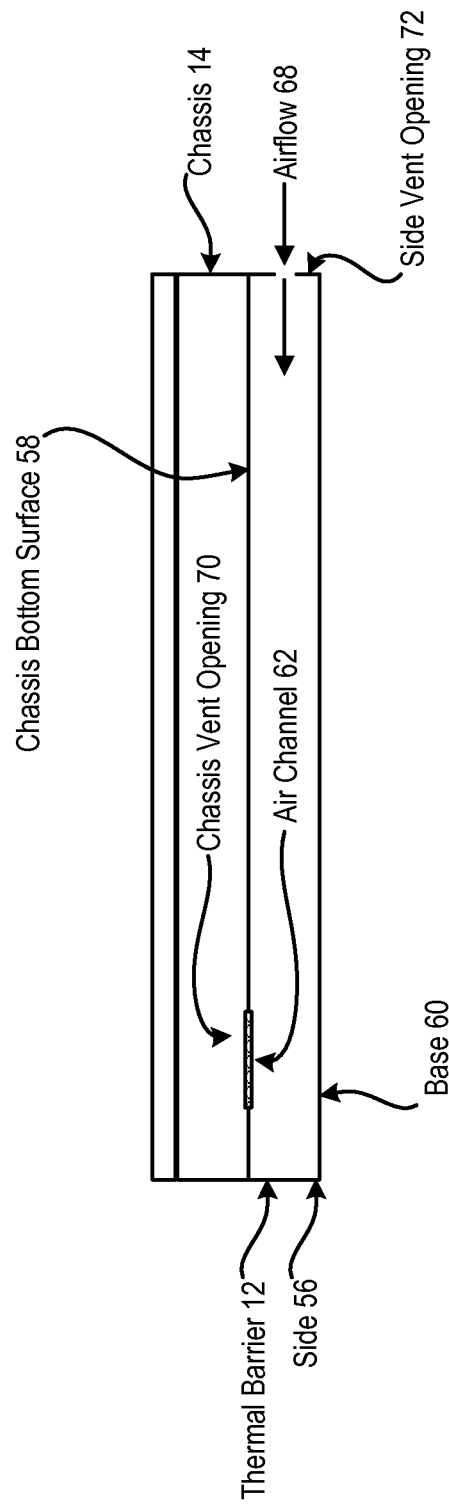
FIG. 6 depicts a side view of a thermal barrier coupled to an information handling system chassis to form an air channel.

Referring now to FIG. 6, a side view depicts a thermal barrier 12 coupled to an information handling system chassis 14 to form an air channel 62. Air channel 62 provides insulation for thermal energy released from chassis 14 through the bottom surface 58, where an end user might come in contact with the thermal energy, such as when resting information handling system 10 in the end user's lap. Air flow 68 passing through air channel 62 helps to cool the base 60 of thermal barrier 12. Attaching thermal barrier 12 to chassis 14 increases the overall height of information handling system 10, making the system more bulky and perhaps more difficult to physically manage. However, an end user can selectively couple or decouple thermal barrier 12 to have either improved cooling at base 60 or improved mobility, depending on the preference of the end user. Selectively coupling and decoupling of thermal barrier 12 provides an end user with flexibility to alter the physical characteristics of information handling system 10, such as size, weight, and thermal characteristics, as well as operating characteristics, such as fan speed and CPU cycles. However, thermal barrier 12 may also permanently couple to information handling system 10 by integration of thermal barrier 12 in the housing of information handling system 10.

Figure 7:
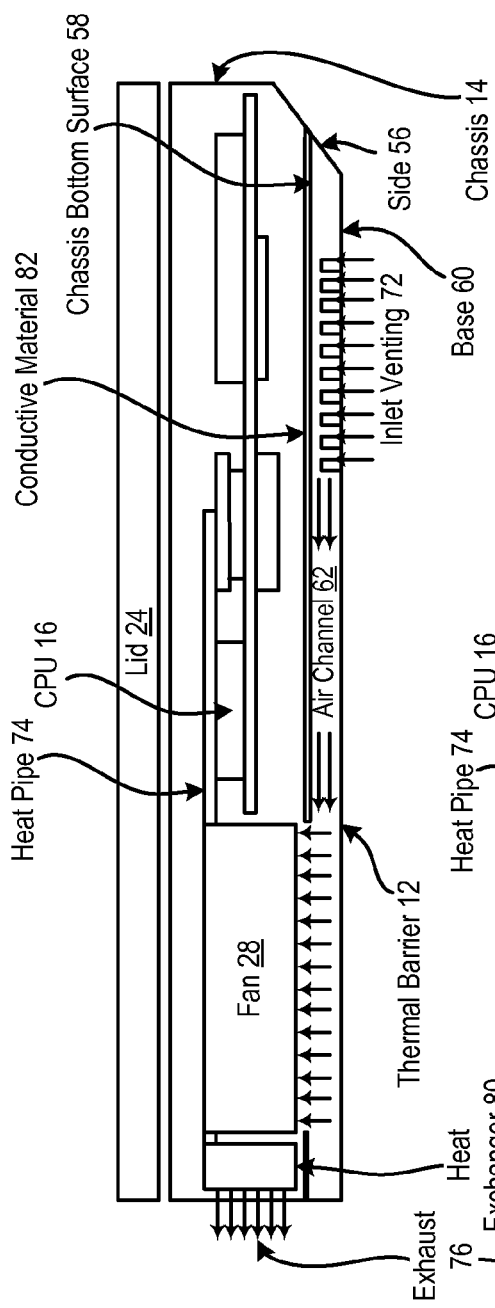
FIG. 7 depicts a side view of a thermal barrier integrated with an information handling system chassis to form a conductive parallel-wall convective heat exchanger.

Referring now to FIG. 7, a side view depicts a thermal barrier 12 integrated with an information handling system chassis 14 to form a conductive parallel-wall convective heat exchanger. Airflow enters through inlet venting 72 formed in the base 60 of thermal barrier 12 to pass through air channel 62, into fan 28 and out an exhaust 76 formed in the side of chassis 14. Thermal energy transfer from processing components, such as CPU 16, to the cooling airflow is enhanced with a heat pipe 74 that conducts thermal energy into the path of the cooling airflow, such as through a heat exchanger 80 disposed in exhaust 76. A conductive material 82 forms the bottom surface 58 of chassis 14 and conducts thermal energy from within chassis 14 to air channel 62 to aid in the removal of thermal energy from within chassis 14. In the example embodiment depicted by FIG. 7, thermal barrier 12 is integrated with chassis 14 as a contiguous component so that thermal barrier 12 is not removed to expose conductive material 82 to an end user. The relatively large surface area of conductive material 82 across the length of air channel 62 provides an increased opportunity for the exchange of thermal energy.

Figure 8:
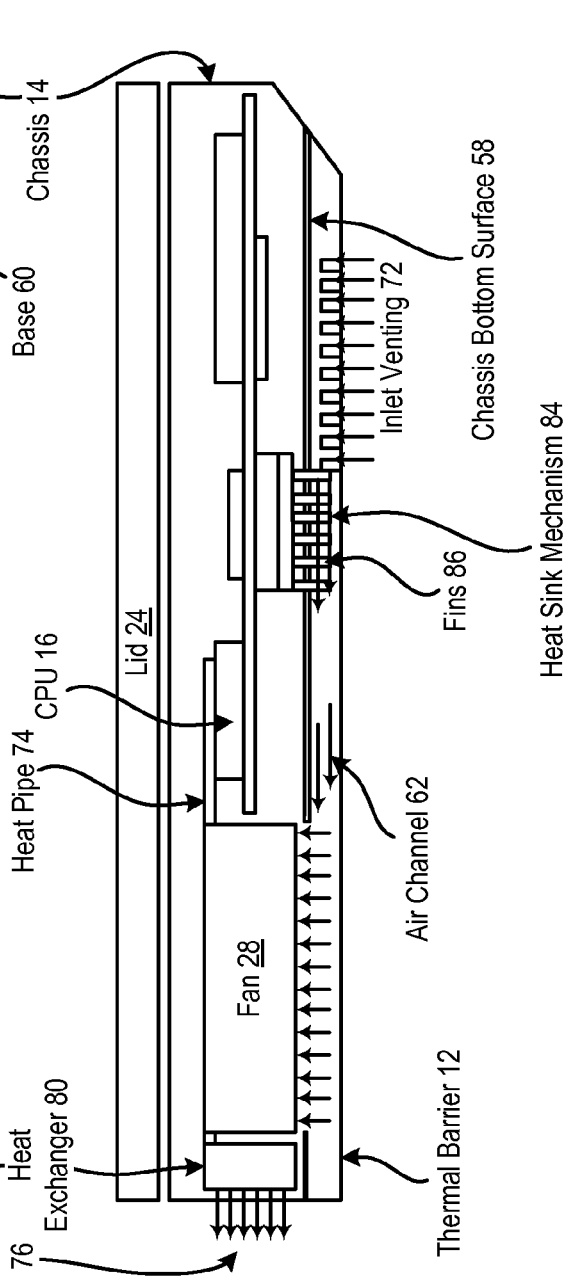
FIG. 8 depicts a side view of a thermal barrier having a heat transfer mechanism extending from the chassis bottom surface into the air channel.

Referring now to FIG. 8, a side view depicts a thermal barrier 12 having a heat transfer mechanism 84 extending from the chassis bottom surface 58 into air channel 62. heat sink mechanism 84 is a conductive material having mass that aids in the absorbing of thermal energy from within chassis 14. Heat sink mechanism 84 couples directly to a component, such as memory, to absorb heat from the component and transfers the heat to fins 86 that provide additional surface area for transfer of thermal energy to air channel 62. In alternative embodiments, heat sink mechanism 84 couples to multiple components through heat pipes or other thermally conductive materials. In the example embodiment depicted by FIG. 8, thermal barrier 12 integrates into chassis 14 to form a contiguous piece so that thermal barrier 12 will not separate from chassis 14 to expose heat sink mechanism 84 to an end user. In alternative embodiments, heat sink mechanism 84 retracts into chassis 14 during operation of information handling system 10 with thermal barrier 12 removed. Extending heat exchanging mechanisms into air channel 62 provides greater flexibility in the design placement of components with reduced reliance on heat pipes and other types of thermal transfer mechanisms because components are more easily cooled in various locations of chassis 14. In other words, component layout is less influenced by the need to achieve adequate cooling so that component layouts may be selected, for instance, to reduce the footprint or vertical height of information handling system 10.

Figure 9:
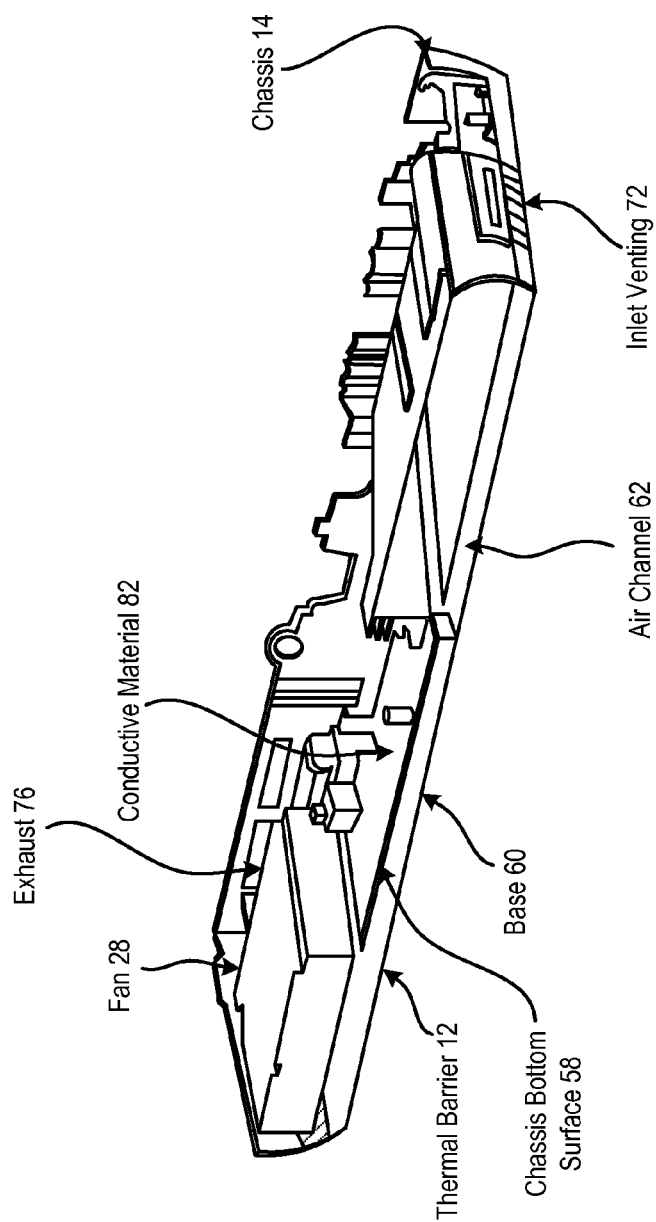
FIG. 9 depicts a cross sectional view of a thermal barrier integrated with an information handling system chassis having a conductive bottom surface.

Referring now to FIG. 9, a cross sectional view depicts a thermal barrier 12 integrated with an information handling system chassis 14 having a conductive bottom surface 58. Bottom surface 58 of chassis 14 has a conductive material 82 exposed across a wide surface area along the length of air channel 62. Pulling cooling airflow from an inlet 72 to an exhaust 76 located at opposing ends of the chassis 14 aids heat transfer from conductive material 82 by having the airflow exposed to conductive material 82 across the length of chassis 14. Air channel 62 provides insulation against transfer of thermal energy to base 60 of thermal barrier 12 to minimize heat felt by an end user in contact with base 60. Base 60 can include an insulating material to further reduce heat transfer to base 60. Integration of thermal barrier 12 into chassis 14 provides a compact system that minimizes the space needed to add air channel 62 since coupling and de-coupling will not take place by an end user.

Figure 10:
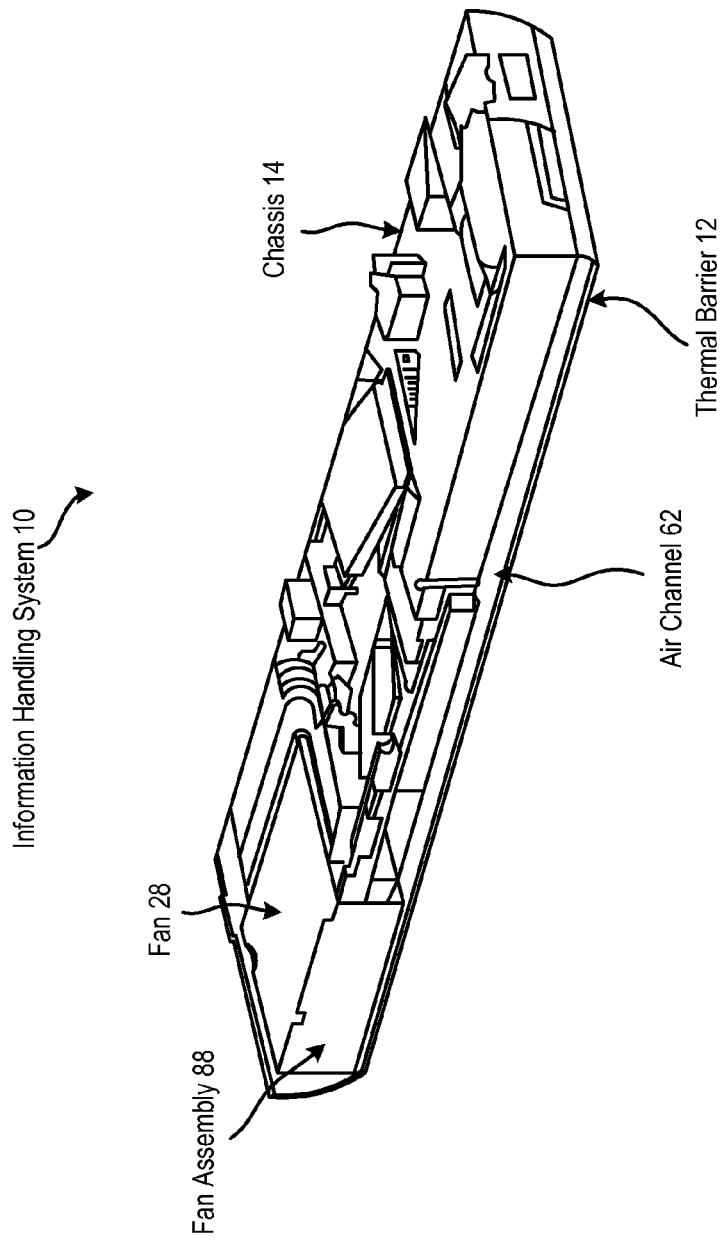
FIG. 10 depicts a cross sectional view of an information handling system having a thermal barrier with a fan assembly that extends from the information handling system chassis into the air channel of the thermal barrier.

Referring now to FIG. 10, a cross sectional view depicts an information handling system 10 having a thermal barrier 12 with a fan assembly 88 that extends from the information handling system chassis 14 into the air channel 62 of the thermal barrier 12. Air channel 62 provides room for the expansion of components where needed while providing a bottom surface at base 60 having reduced thermal energy and also smooth and free of physical discontinuities. In the example embodiment depicted by FIG. 10, fan assembly 88 that contains fan 28 extends into air channel 62 to improve airflow from air channel 62 to fan 28. The ability to accept a larger fan assembly by expanding into air channel 62 provides increased cooling performance with lower acoustics.

Figure 11:
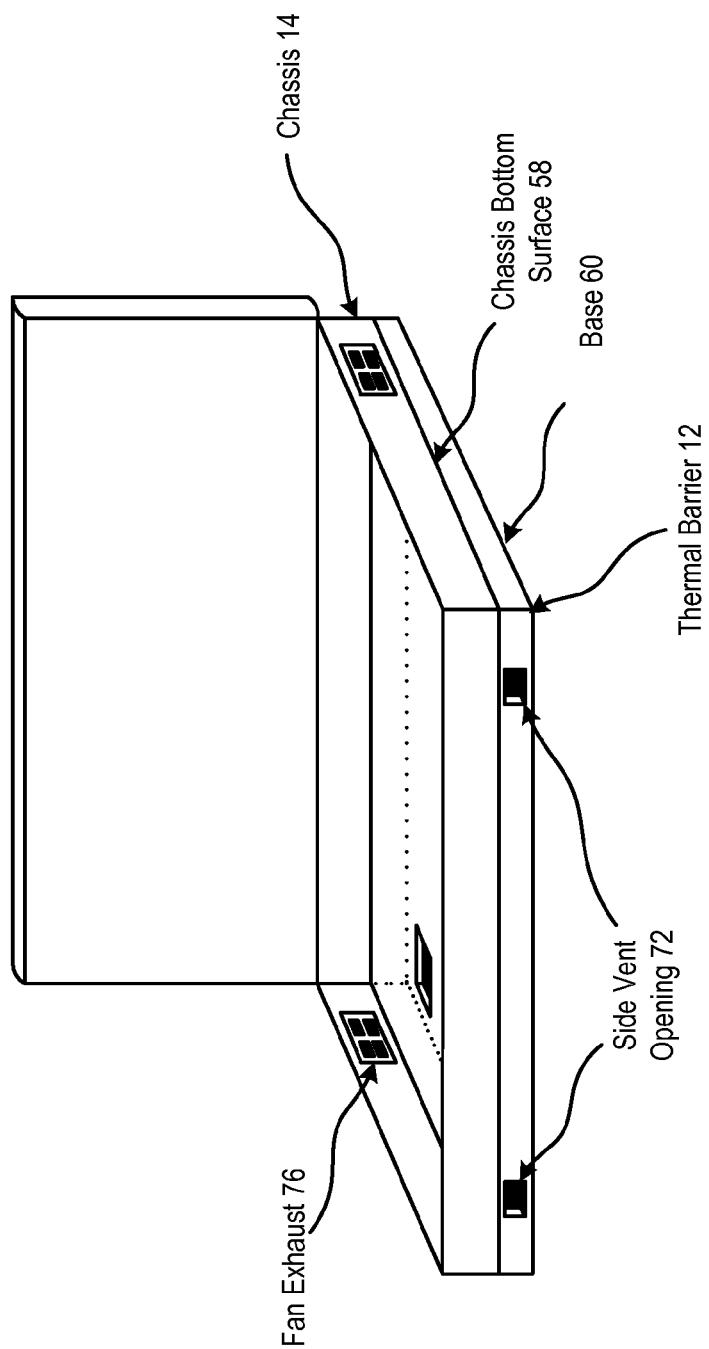
FIG. 11 depicts a side perspective view of an information handling system chassis having an integrated thermal barrier with plural vent locations.

Referring now to FIG. 11, a side perspective view depicts an information handling system chassis having an integrated thermal barrier with plural vent locations. The chassis bottom surface and base 60 form a parallel-wall thermal barrier 12 integrated into chassis 14 as a contiguous unit. Air flow pulled by a fan from side vent openings 72 through chassis vent opening 70 helps to prevent conduction of thermal energy by processing components located above chassis bottom surface 58 to base 60, thus maintaining base 60 at a reduced temperature. The parallel wall structure formed by base 60 and chassis bottom surface 58 provides insulation against transfer of thermal energy, which is further aided by the cooling airflow drawn through the air channel structure during operation of a fan to pull air through chassis vent opening 60. Integration of thermal barrier 12 with chassis 14 into a single contiguous part allows the projection of heat transfer devices or even processing components into the air channel formed between base 60 and chassis bottom surface 58 to enhance cooling, such as is depicted by FIG. 8. For instance, having thermal barrier permanently coupled to chassis 14 so that an end user cannot select to remove thermal barrier 12 reduces the risk of injury to the end user by contact to heated parts. In some instances, thermal barrier 12 is permanently coupled with screws or similar devices so that a technician can access components through chassis bottom surface 58 while access is restricted by end users. In an example embodiment, chassis bottom surface 58 is made of thermally conductive material, such as a metal, that helps to conduct thermal energy from within chassis 14 to the cooling airflow within the air channel defined by thermal barrier 12, while base 60 is made of a material having limited thermal conductivity, such as a thermoplastic to enhance insulation against thermal energy proceeding from chassis 14 through base 60. FIG. 11 depicts plural side vent openings formed in thermal barrier 12 to draw cooling airflow into the air channel from different locations. For example, one opening 72 is formed proximate to a memory heat sink and another larger opening 72 is located proximate a CPU heat sink so that a cooling airflow of varying intensity is pull directly across each heat sink. Alternatively, multiple openings 72 may be placed around the outer edge of thermal barrier 12 to provide a desired airflow through the air channel of thermal barrier 12.

Although the present invention has been described in detail, it should be understood that various changes, substitutions and alterations can be made hereto without departing from the spirit and scope of the invention as defined by the appended claims.

What is claimed is:

1. An information handling system comprising:
   a chassis having a bottom surface and a base integrated together by four sides to form an integrated thermal barrier, one of the sides having one side vent opening, the chassis bottom surface having one chassis vent opening proximate the side opposite the one side vent opening, the integrated thermal barrier having a space defined by the bottom surface, base and four sides that does not have any processing components disposed in the space;
   plural processing components disposed in the chassis and operable to process information; and
   a fan disposed in the chassis and generating an airflow from the one side vent opening through the chassis vent opening to draw air through the integrated thermal barrier and into the chassis.

2. The information handling system of claim 1 wherein the chassis has an exhaust so that the airflow from the side vent opening through the integrated thermal barrier and into the chassis vent opening travels substantially the length of the chassis bottom surface before entering the chassis vent opening to exit through the exhaust of the chassis.

3. The information handling system of claim 1 further comprising a heat transfer device extending from a processing component through the chassis bottom surface and into the integrated thermal barrier space.

4. The information handling system of claim 1 wherein the integrated thermal barrier base comprises a material operable to insulate heat from the chassis passing out the base.

5. The information handling system of claim 1 wherein the chassis bottom surface comprises a thermally-conductive material operable to conduct heat from the chassis into the integrated thermal barrier space.

6. The information handling system of claim 1 wherein the fan extends through the chassis bottom surface and into the integrated thermal barrier.

7. The information handling system of claim 1 wherein the thermal barrier sides and chassis bottom surface are sealed to form an air channel within the integrated thermal barrier.

8. A method for managing cooling of an information handling system, the method comprising:
   integrating a thermal barrier at the bottom surface of a chassis of the information handling system to form an air channel, the thermal barrier having only one thermal barrier vent proximate a side of the thermal barrier, the chassis bottom surface having only one chassis bottom surface vent proximate an opposing side of the thermal barrier, the thermal barrier and chassis forming a contiguous component that prevents coupling and decoupling of the thermal barrier to the chassis; and
   pulling an airflow from the thermal barrier vent through the air channel and into chassis bottom surface vent, the airflow exhausted from the information handling system chassis through an exhaust formed in the chassis.

9. The method of claim 8 further comprising:
   disposing a thermally conductive material in the air channel; and
   conducting heat from the information handling system through the thermally conductive material into the airflow through the air channel.

10. The method of claim 8 further comprising:
    extending a heat sink from a processing component of the information handling system through the bottom surface and into the air channel; and
    conducting heat through the heat sink into the airflow through the air channel.

11. The method of claim 10 further comprising:
    conducting heat from processing components disposed in the chassis through a heat pipe to a heat exchanger proximate the exhaust; and
    passing the airflow from the chassis bottom surface vent through the heat exchanger and then out the exhaust.

12. The method of claim 8 wherein coupling a thermal barrier further comprises:
    sealing the thermal barrier against the chassis bottom surface so that air is drawn substantially only through the thermal barrier vent into the chassis.

13. The method of claim 12 further comprising drawing air into the chassis from the thermal barrier with a fan disposed in the chassis bottom surface vent.

14. The method of claim 8 wherein pulling an airflow further comprises pulling air across substantially the entire length of the chassis bottom surface, the chassis bottom surface having a conductive material that transfers thermal energy from the chassis and into the air channel.

15. The method of claim 8 wherein pulling an airflow further comprises insulating.

16. An information handling system comprising:
    a chassis having an exhaust and a bottom surface, the bottom surface having only one chassis vent opening formed proximate a first end, the chassis supporting processing components disposed over the bottom surface;

a thermal barrier having a base and four sides, the four sides integrated with the chassis bottom surface as a contiguous unit that prevents coupling and decoupling of the thermal barrier to the chassis, the thermal barrier and chassis bottom surface cooperating to form an air channel between the base and the bottom surface, the thermal barrier having one thermal barrier vent opening formed at a second end opposite the first end, the air channel directly exposed to the chassis bottom surface to transfer thermal energy from the chassis bottom surface to air in the air channel; and a fan disposed at least in part in the chassis, the fan drawing the air through the thermal barrier vent opening, then through the air channel, then into the chassis vent opening and out the exhaust.

17. The system of claim 16 further comprising a heat sink extending through the chassis bottom surface and into the air channel, the heat sink operable to transfer thermal energy from the chassis into the air channel.

18. The system of claim 16 wherein the chassis bottom surface comprises a thermally conductive material and the thermal barrier comprises a thermally insulative material.

* * * * *